United States Patent [19]

Havens et al.

[11] Patent Number: 4,848,566
[45] Date of Patent: Jul. 18, 1989

[54] ANTISTATIC/CONDUCTIVE CONTAINER

[75] Inventors: Marvin R. Havens, Greer, S.C.; Robert R. Wilkie, Roanoke Rapids, N.C.

[73] Assignee: W. R. Grace & Co., Duncan, S.C.

[21] Appl. No.: 158,417

[22] Filed: Feb. 22, 1988

Related U.S. Application Data

[63] Continuation-in-part of Ser. No. 112,806, Oct. 13, 1987, abandoned.

[51] Int. Cl.⁴ .............................................. B65D 73/02
[52] U.S. Cl. ...................................... 206/328; 428/922
[58] Field of Search ....................... 206/328, 332, 334; 428/922

[56] References Cited

U.S. PATENT DOCUMENTS 3,355,313  11/1967  Eastes ..................................... 117/47
4,171,049  10/1979  Nahara ................................. 206/328
4,333,565   6/1982  Woods .................................. 206/329
4,494,651   1/1985  Malcolm ............................... 206/328
4,590,534   5/1986  Akamatsu et al. ................... 206/328
4,648,508   3/1987  Neal et al. ............................ 206/328
4,662,514   5/1987  Berbeco .............................. 206/328
4,711,350  12/1987  Yen ..................................... 206/328

FOREIGN PATENT DOCUMENTS 810595  9/1962  Canada .

Primary Examiner—Joseph Man-Fu Moy
Attorney, Agent, or Firm—John J. Toney; William D. Lee, Jr.; Mark B. Quatt

[57] ABSTRACT

A blow molded container provides protection for electrically sensitive devices by including antistatic agents in the outer layer and electrically conductive agents in the inner layer of a multilayer parison used to form a container. The invention renders the use of separate antistatic foam pads unnecessary by providing an antistatic surface in the container when closed.

7 Claims, 2 Drawing Sheets

ANTISTATIC/CONDUCTIVE CONTAINER

This application is a continuation in part of application Ser. No. 112,806 filed on Oct. 23, 1987, now abandoned.

FIELD OF THE INVENTION

The field of the invention encompasses portable containers for the electrostatic discharge protection of sensitive electronic circuits or solid state devices during transportation and storage. More particularly, the present invention includes containers which, while closed, protect the contents of the container from external electrical and physical forces.

BACKGROUND OF THE INVENTION

When two bodies, particularly of unlike materials, are brought together into intimate contact, a redistribution of electrons across the interface is likely to occur. An attractive force is established as equilibrium is achieved. Work must be done in opposition to these attractive forces if and when the bodies are separated. The energy so expended manifests itself as an increase in electrical tension or voltage between the respective surfaces, which become electrically charged with respect to each other. If a conductive path is available, the charges thus separated will reunite immediately. If no such path is available, as in the case of nonconductors, the potential increase with separation may reach values of several thousand volts. The generation of such electrical forces by contact is known as triboelectricity.

The charge on a charged object will be located on the exterior surface thereof, and these forces have a strong influence on nearby objects. If a neighboring object is a conductor it will experience a separation of charges by induction. Its repelled charge is free to give or receive electrons as the case may be; if another conductor is brought near, the transfer may occur through the agency of the spark, very often an energetic spark.

Triboelectrically generated charges may adversely affect or even electronically destroy a number of electronic circuits or solid state devices sensitive to sudden or stray electric charges or static electricity. Micro-circuit devices such as integrated circuit chips may be destroyed or weakened by electrostatic discharge prior to their incorporation into the electrical or electronic equipment for which they were designed. Damage from electrostatic discharge may make such devices prone to latent or catastrophic failure during use.

To prevent electrostatic breakdown, containers in which such devices are stored and transported have been provided with means for short circuiting the device terminals or pins. This short circuiting serves to prevent the accumulation of potentially damaging static charges on the device.

U.S. Pat. No. 4,171,049 discusses the utilization of a series of conductive slots or grooves in which solid state devices may be inserted and later dispensed to manufacturing equipment.

Other containers have been developed for portable use as for example in the device replacement market. These are typically small box like containers that house conductive sponge or foam sheets into which the device terminals are temporarily imbedded. An example is found in U.S. Pat. No. 4,333,565.

In addition to the requirements for inhibiting electrostatic charge build up and shielding solid state devices from electrical fields, a container useful for transporting such devices should also provide protection from mechanical shock and vibration. In addition, such a container should be of lightweight construction and convenient to use when gaining access to the equipment to be repaired. The container should also be adaptable to the storage of different sizes and shapes of solid state devices without change in the size and shape of the container itself. Reuseability, tamper security, and cost economy are also important considerations.

Many of the containers referred to above are designed for online infactory production use and do not meet many of the requirements desirable in a portable container. For example, many of the prior art containers are not adaptable to solid state devices of different shapes and sizes.

Another means well known in the art for providing protection of solid state devices is the use of carbon black or carbon powder in varying amounts in the material forming the container for the solid state devices.

U.S. Pat. No. 4,494,651 issued to Malcolm discloses a portable work station in which electrically conductive material, such as carbon black particles, aluminum particles, and metal filings, is blended with thermoplastic material to make an electrically conductive case.

Electrically conductive containers are often provided with an electrically conductive or antistatic foam pad which is used to line the bottom interior surface of the container. The foam pad has hygroscopic wetting or other antistatic agents incorporated therein or thereon.

The presence of the wetting agents, which attract moisture to the surface of the pad, substantially diminishes the possibility of static electricity being generated in the interior of the container as the result of friction between the solid state devices and the foam pads supporting the devices. Moreover, since the foam pad has been rendered electrically conductive and is in electrically conductive communication with the container, any static charge which may be internally generated will harmlessly float to the surface of the enclosure means.

A preferred material for the pad is known in the art as "pink poly". This material is a polyethylene, such as low density polyethylene, which has been impregnated with an organic liquid which can act as a hygroscopic wetting agent to attract and hold moisture onto the surface of the pad to render the pad electrically conductive. The pad may also be formed in an electrically conductive loaded plastic foam such as carbon or aluminum loaded polyurethane foam. This second material differs from the first material in that the electrical conductivity is present throughout the foam pad as opposed to the surface only of the pad. Still another type of conductive pad is a polyethylene foam which has been sprayed with a conductive carbon or similar conductive solution to affect a conductive surface layer.

These pads are typically preshaped to the configuration of the solid state device to accommodate the shape of the container, and are designed to direct static charges generated by frictional movement or other slight vibrations of the solid state device against the pad to the surface of the container. Typical hygroscopic wetting agents used in conjunction with the internal foam pads are well known to those skilled in the art and disclosed for example in U.S. Pat. No. 3,355,313 Eastes and Canadian Patent No. 810,595 also issued to Eastes.

One negative feature associated with the use of such internal pads, such as "pink poly" pads is that the antiblocking or wetting agent used to provide the antistatic effect and to render the pad electrically conductive, may also deteriorate a solid state device.

It has also been found that at elevated temperatures volatiles can be produced in the pink polyethylene foam pad which can corrode a solid state device.

Of course, an additional consideration is the cost of installing these pads in each container.

It is, therefore, an object of the present invention to provide a means for protecting solid state devices within an electrically conductive container without the need for internal polyethylene foam pads or the like.

SUMMARY OF THE INVENTION

In one aspect of the present invention, a blow molded container suitable for storing and transporting a solid state device comprises body and cover portions, the surface of said container comprising a blend of a polymeric resin and an antistatic agent.

In another aspect of the present invention, a blow molded container comprises body and cover portions formed from a multilayer parison comprising an outer layer of a first blend of a polymeric resin and an antistatic agent and an inner layer of a second blend of a polymeric resin and an electrically conductive agent.

In still another aspect of the present invention, a process for making a blow molded container comprises blending a first polymeric material with an antistatic agent; blending a second polymeric material with an electrically conductive agent; coextruding a multi-layer parison so that the first blend forms an outer layer, and the second blend forms an inner layer of the parison; and blow molding the parison to provide a body and cover portion each having an antistatic surface layer and an electrically conductive inner layer.

DEFINITIONS

The term "electrically conductive", and similar terms, are used herein to describe a material having a surface resistivity of less than $10^5$ ohms/square (Department of Defense Standards).

The term "solid state device" is used herein to describe devices such as electronic devices whose utility maybe impaired or destroyed by charge transfer actions, static electricity, or electrostatic discharge.

The term "antistatic" as used herein describes material having a surface resistivity in the range of about $10^9$ to $10^{14}$ ohms/square (Department of Defense Standard) and/or a material which can dissipate 99% of an applied static charge of $\pm 5000$ volts direct current in a short amount of time, preferably less than 20 seconds, more preferably less than 5 seconds, most preferably less than 2 seconds (Federal Test Method Standard 101C, Method 4046.1, "Electrostatic Properties of Materials"), and/or a material having a surface resistivity in the range of about $10^5$ to $10^{13}$ ohms/square (Electronics Industry Association Standard).

The term "parison" is used herein to refer to a hollow tube or other preformed shape of a thermoplastic material or blend or aggregation of thermoplastic materials which is inflated inside a mold in the blow molding process.

"Polymeric resin" as used herein includes but is not limited to for example homopolymers, copolymers, terpolymers etc., and blends and modifications thereof and more specifically polyolefins as defined hereunder. Polyesters, polyamides, polycarbontes and the like are also included herein.

The term "outer layer" is used herein to refer to a layer of a multi-layer parison which comprises an outer surface thereof.

The term "inner layer" is used herein to refer to a layer of a multi-layer parison other than the outer layer, such as an intermediate layer or innermost layer of the parison.

The term "intermediate layer" is used herein to refer to a layer of a multi-layer parison positioned between an outer layer and an innermost layer.

The term "polyolefine" is used herein to refer to a polymer of olefins such as ethylene, propylene, etc., and copolymers and modifications thereof, such as linear low density polyethylene (LLDPE) and ethylene vinyl acetate copolymer.

The term "regrind" is used herein to refer to waste material such as excess parison material from blow-molding operations, which is reclaimed by for example shredding or granulating of the excess material. This regrind material is generally mixed with other unprocessed material at some predetermined percentage.

"Exposed surface" is used herein to indicate those surfaces of a container, including the outside surface of a closed container as well as the surfaces exposed by opening the container, which maybe said to be exposed to the atmosphere.

DETAILED DESCRIPTION OF THE PREFERRED EMBODIMENTS

Figure 1:
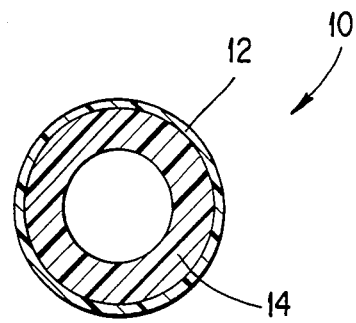
FIG. 1 is a sectional view of a coextruded multi-layer parison in accordance with the present invention.

Referring to FIG. 1, a multi-layer parison 10 is coextruded and then formed into a blow molded container. Parison 10 includes an outer layer 12 comprising a blend of a polymeric resin, preferably a polyolefin and more preferably linear low density polyethylene, and an antistatic agent to provide antistatic characteristics to the exposed surface of the container formed from the parison.

Antistatic agents suitable for use in the outer layer 12 may be for example an organic liquid which acts as a wetting agent, or for example ionic surface-active agents which will migrate to the surface of the outer layer 12 to provide the antistatic characteristics necessary in the surface of the resulting container.

Antistatic agents useful in the present invention may also be those which are substantially non-hygroscopic and substantially nonmigratable, and such antistatic agents may be selected from the aromatic sulfonamides. The aromatic sulfonamides may be ortho, meta, or para substituted on the benzene ring thereof, or may be N-substituted on the amide group thereof. Representative examples of aromatic sulfonamides include, but ar not limited to, o,p-toluenesulfonamide, N-ethyl-o,p-toluenesulfonamide, N-butyl benzene sulfonamide, or benzenesulfonamide.

Various companies supply aromatic sulfonamides. For instance a mixture of ortho and para toluenesulfonamide was formerly supplied by Monsanto Company, St. Louis, Mo., under the name Santicizer (TM) 9, and currently by Akzo Chemie America, Chicago, Ill., under the name Ketjenflex (TM) 9. N-ethyl-ortho,para-toluenesulfonamide was formerly supplied by Monsanto Company under the name Santicizer (TM) 8, and currently by Akzo Chemie America under the name Ketjenflex (TM) 8. N-butyl benzene sulfonamide is supplied by Unitex Chemical Corporation, Greensboro, N.C., under the name Uniplex (TM) 214.

In a preferred embodiment, the antistatic polymeric composition which maybe employed in the outer layer of the parison is obtained from N-butyl benzene sulfonamide in an amount of about 15% to about 30% by weight of the total which has been mixed in a blender with nylon 12, and the resultant granulation pelletized. Preferably, a nylon 6/12, in a weight amount less than the nylon 12, is included in the blending. Also nylon 12 containing about 30% by weight N-butyl benzenesulfonamide and about 15% by weight nylon 6/12 can be purchased as Grilamid (TM) L25N150 and nylon 12 containing about 15% by weight N-butyl benzenesulfonamide and about 15% by weight nylon 6/12 can be purchased as Grilamid (TM) L25W40, both of which are marketed by Emser Werke AG, Zurich, Switzerland.

The antistatic polymeric composition of the outer layer 12 of the parison may alternatively comprise a blend of a polyolefin with a small amount of one or more of the following antistatic agents. Suitable antistatic agents maybe selected from (a) fatty acid esters of polyhydroxy alcohols; (b) polyalkoxylated compounds (i.e. polyethers) such as polyethylene oxides, polypropylene oxides, polybutylene oxides, polytetramethylene oxides, the reaction products of polyalkoxylates with fatty acids, the reaction products of polyalkoxylates with fatty alcohols, the reaction products of polyalkoxylates with fatty acid esters of polyhydroxyl alcohols (for instance polyalkoxylate reaction products of fatty acids, of fatty glycols, of fatty sorbitols, or fatty sorbitans, and of fatty alcohols), or a mixture thereof, or a mixture of (a) and (b). Suitable fatty group chains in either (a) or (b) are desirably from about $C_8$ to about $C_{50}$, or even higher. Natural fatty groups are in the lower range and synthetic ones are in the higher range. For instance, Unithox (TM), a reaction product of polyalkoxylate with fatty alcohol, is an ethoxylated synthetic fatty alcohol supplied by Petrolite Corporation, which may have up to about 50 carbons in the fatty group chain. The polyether chains in the suitable polyalkoxylated compounds are of the formula $(—OC_xH_{2x}—)_n$ wherein x is from 2 to about 8, wherein the alkyl group is straight or branched, and wherein n is from 2 to about 1000. Each agent will work by itself in a polymeric composition, as such antistatic compositions exhibit excellent static decay times; however, the combination of agents (a) and (b) in a polymeric composition is more desirable as these antistatic compositions display even shorter static decay times. Desirable fatty acid ester substituted polyhydroxy alcohols include, but ar not limited to, the polyhydroxy alcohols selected from the $C_2$ to $C_6$ alcohols, such as ethylene glycol, 1,3-propylene glycol, 1,2-propylene glycol, 1,2-butanediol, meso2,3-butanediol, 1,4-butanediol, pinacol, pentaerythritol, 1,2,3,4,5-pentanepentol, sorbitan, or sorbitol, which polyhydroxy alcohol has been substituted with one or more fatty acid ester groups. A very desirable fatty acid ester substituted polyhydroxy alcohol is glycerol monostearate. A desirable polyether is polyethylene oxide, such as that sold by Union Carbide under the trade name Polyox, or is polytetramethylene oxide, such as that sold by du Pont under the trade name Tetathane. A very desirable polyalkoxylate of a fatty alcohol is a polyethoxylated cetyl alcohol, as represented by the formula $C_{16}H_{33}—O(—C_2H_4—O—)_nH$ wherein n is from 2 to about 50.

Preferred composition for outer layer 12 is an acid copolymer/quaternary amine mixture comprising (A) a polymer containing carboxylic acid moieties and (B) an antistatically effective amount of a quaternary amine wherein:

(A) the polymer containing carboxylic acid moieties is a copolymer of (i) a major amount by mol % of an alphaolefin of the formula $RCH=CH_2$ wherein R is H or $C_1$ to $C_8$ alkyl, and (ii) a minor amount by mol % of an alpha, beta-ethylenically unsaturated carboxylic acid, and (B) the quaternary amine is of the formula

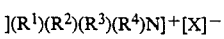

wherein $R^1$ is selected from H, aryl, $C_1$ to $C_{50}$ alkyl optionally having one or more non-contiguous $C=O$ or $NHC=O$ or $—S—$ or $—O—$ in the carbon chain, or the same as $R^2$;

each of $R^2$, $R^3$, and $R^4$, is the same or different and selected from H, $C_1$ to $C_{18}$ alkyl optionally substituted with one or more OH or from $—(R^5—O)_a—H$ where a is an integer from 1 to 10 and $R^5$ is ethylene or propylene; and X is an anion selected from chloride, bromide, iodide, nitrate, fluoborate, phosphate, $C_1$ to $C_8$ alkyl phosphate, sulfate, $C_1$ to $C_8$ alkyl sulfate, formate, $C_1$ to $C_8$ alkyl or $C_6$ to $C_{24}$ alkaryl or aryl sulfonate, acetate, trifluoroacetate, citrate, pripionate, tartrate or carbonate.

Another preferred blend for outer layer 12 comprises a blend of linear low density polyethylene with a small amount of the polyethoxylated cetyl alcohol and/or glycerol monostearate. An even more preferred blend includes about 98.5% LLDPE, about 1% of the polyethoxylated cetyl alcohol, and about 0.5% glycerol monostearate. All percentages are by weight of the total blend. A small percentage, preferably about 5%, of an antiblocking agent, may be added to this blend prior to blow-molding. A suitable antiblocking agent is micronsized silica available from Teknor Apex.

An inner layer 14 of the multi-layer parison preferably comprises a blend of a polymeric resin, more preferably a polyolefin, and even more preferably a high density polyethylene; and electrically conductive particles such as carbon black, carbon fibers, and the like.

Figure 3:
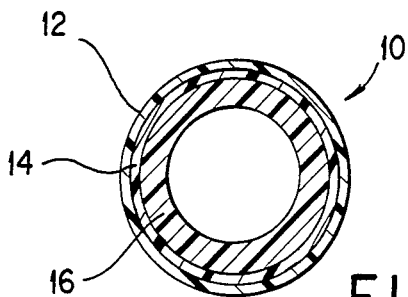
FIG. 3 is an alternate embodiment of a coextruded multi-layer parison of the invention.
Figure 4:
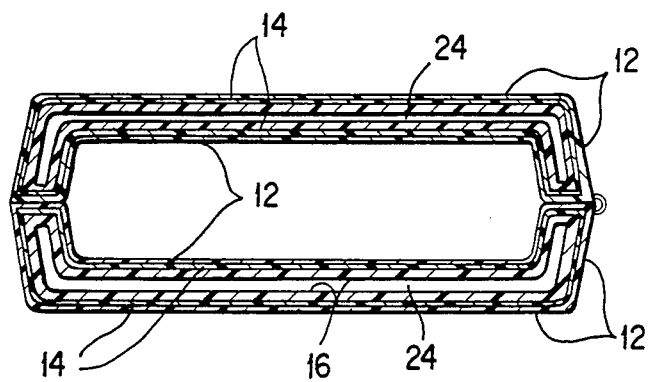
FIG. 4 is an elevational cross-section of a blow molded container utilizing the parison of FIG. 3.

An optional additional inner layer 16 may be coextruded simultaneously with outer layer 12 and inner layer 14. Layer 16 is a polymeric material, preferably a blend of a polymer and a regrind material for example a regrind high density polyethylene or other polyethylene or polyolefin materials. Most preferably, optional layer 16 comprises a blend of high density polyethylene and a regrind material. A three-layer parison and a blow molded container made therefrom are shown in FIGS. 3 and 4. The use of regrind material provides cost savings in the production of electrically conductive containers, without jeopardizing the effectiveness of the container for the storage and transport of electrically sensitive devices.

In one preferred embodiment, the outer layer 12 comprises about 15% of the total weight of the multi-layer parison, and the inner layer 14 and optional layer 16 each comprise about 15% and 70% respectively of the total thickness of the parison.

Where no layer 16 is present, the inner layer 14 preferably comprises about 85% of the total thickness of the parison and the outer layer 12 comprises about 15% of the total thickness.

It should be noted that when carbon fibers or other conductive fibers are used in a blow molding process, these fibers resist the requisite stretching during the molding process and, if used throughout the multilayer parison, would result in breaking of the parison during the blow molding operation. These fibers are therefore confined, if used, to the inner layer 14 of the multi-layer parison to impart the required electrical conductivity to the resulting blow molded container but without affecting the blow molding operation. It should be clear to someone of ordinary skill in the art that a reduction in the preferred percentage of carbon fibers or other conductive fibers in the inner blend layer 14 may permit, to some extent, a relative thickening of the inner layer 14 in relation to the total multi-layer parison thickness without seriously affecting the blow molding operation. However, alteration of the concentration of carbon fibers in the inner layer may also affect the degree of electrical conductivity of the inner layer 14.

Conversely, an increase in the percentage of carbon fibers or other fibers in the inner blend layer 14 may permit, to some extent, a relative thinning of the inner layer in relation to the total multi-layer parison thickness, without losing the desired electrical conductivity of the inner layer.

A preferred method of manufacturing the container is blow molding. Blow molding is generally well known to those of ordinary skill in the art, as illustrated by U.S. Pat. Nos. 3,452,125 and 3,317,955 disclosing blow molding techniques and methods. In practice, a first blend of a polymeric resin such as a polyolefin, more preferably linear low density polyethylene, is blended with any suitable antistatic agent. A second blend of a polymeric resin such as a polyolefin, more preferably polyethylene, and most preferably high density polyethylene, is blended with carbon black or conductive fibers such as carbon fibers in a relatively small percentage, for example about 10% of the carbon or fibers in relation to the total weight of the blend layer. These blends are then coextruded with the first blend as an outer layer and the second blend as an inner layer, and optionally with an additional inner layer of a polymeric material and/or regrind material. The materials are heated to a temperature whereby the thermoplastic materials may be extruded as a parison and blow molded into the desired shape or configuration as is well known in the art.

Figure 2:
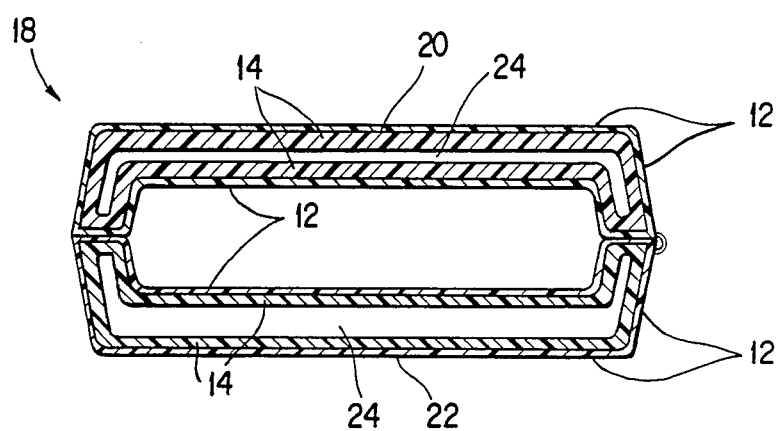
FIG. 2 is an elevational cross-section of a blow molded container utilizing the multi-layer parison.

FIG. 2 shows a resulting blow molded container 18 wherein the multilayer parison has been blow molded to form the cover portion 20 and body portion 22 of the container. It can be seen from the drawing figure that when the container 18 is closed, the first blend of outer layer 12 forms the outside surface of the container, as well as the interior surface of the container. Thus an antistatic surface is provided on the outside and inside exposed surfaces of container 18. This invention therefore obviates the need for a separate or discrete antistatic pad such as the "pink poly" antistatic pads conventionally used, and with this avoids the cost of such pads and the cost of properly installing such pads in ESD sensitive device containers, as well as the deteriorating effect of pink poly on ESD sensitive devices stored in such containers.

The preferred container, illustrated in FIG. 2, is of "double wall" construction, well known in the art for provided enhanced protection against mechanical shock and abuse. central region 24 of cover portion 20 and body portion 22 represents the space between the double walls 14.

In an alternate embodiment of the invention, FIG. 3 shows a multilayer parison have an antistatic outer layer 12, an inner electrically conductive layer 14, and an additional inner layer 16 as described earlier. Each layer may be gauged to appropriate thicknesses depending on the requirements of the particular container. For example, inner layer 16 may be of relatively thick gauge to provide structural strength to the parison during the blow molding operation, and to the final container. If layer 14 contains electrically conductive fibers such as carbon fibers, it may be necessary to rely largely on the strength of outer layer 12 and inner layer 16 for this purpose.

The blend of outer layer 12 most preferably comprises about 15% of the total parison thickness. Variations from this range may be suitable depending on the requirements of the final container, i.e. the final end use. Clearly, an antistatic layer forming more than 15% of the total parison thickness will provide more antistatic agent to the final container. Thicknesses less than 15% may be utilized provided sufficient material is present to offer minimum antistatic protection for the ESD sensitive devices to be packaged.

Similarly, although inner layer 14 will most preferably form 15% of the total parison thickness, thickness percentage may vary from this as long as minimal strength, conductivity, and other properties affected by such variations are met.

The additional inner layer 16 may be used to render a more economical container by the use of regrind material, and although typically this layer will form a major proportion of the parison and container, e.g. 70%, greater or lesser percentages will nevertheless be suitable as long as the other functional layers are disposed in sufficient thickness and/or density of antistatic and electrically conductive materials respectively to adequately protect ESD sensitive devices held in the container.

FIG. 4 illustrates a final blow molded container blow-molded from the parison depicted in FIG. 3 and described above. This container is similar in all respects to that of FIG. 2, except that additional inner layer 16, rather than inner layer 14, will form the surface of the double walls which encompass and form central region 24 of the doublewalled embodiment. Electrically conductive inner layer 14 will therefore become an intermediate layer, forming neither an exposed surface of the container 18 nor a surface of the double wall in an embodiment utilizing the doublewall design.

By the use of the present invention, an antistatic surface is provided on the interior exposed surface and the exterior exposed surface of the blow-molded container. This substantially eliminates the danger of sparking when charged objects are brought near the case. This protection helps to insure that the ESD sensitive device in the container will not be damaged during storage and shipment. The antistatic surface layers also have a resistance sufficient to bleed off static charge that may otherwise build up on the container.

When the container is closed, the invention provides a Faraday Cage to protect sensitive components from electric fields.

Several additional advantages are offered by the practice of the invention. For example, with the use of conventional antistatic foam pads, there is always a possibility of the pad dislodging from the container, and thereby raising the risk of electrostatic damage to the ESD sensitive contents of the container, or requiring the replacement of the pads. Another advantage is the additional space available within the container which would otherwise be occupied with the antistatic pads.

Although the present invention has been described in connection with preferred embodiments, one skilled in the art will understand that modifications may be made without departing from the scope of the invention. For example, instead of the first blend as described above a single polymeric resin may be used without the addition of an antistatic agent therein. This combination may be suitable where an antistatic outer surface is not required. Likewise, the antistatic outer layer may be employed but with a non-conductive inner layer comprising a single polymeric resin without the addition of electrically conductive particles. Such a combination may be useful where a conductive inner layer is not required. Although the need for internal polyethylene foam pads or the like is obviated by the practice of the present invention, such pads may offer some usefulness in connection with the packaging of e.g. products of varying relief or profile. Thus, use of such pads is considered to be an option still within the scope of the invention, and not inconsistent therewith.

Also, although the embodiments have been directed to a blow molded container of doublewall design, clearly a single-wall container can be made which nevertheless utilizes to advantage the antistatic and/or electrically conductive features of this invention. Additionally, containers of related molding techniques may nevertheless take advantage of the antistatic conductive layer feature of the invention. Injection molding is an example of another molding technique.

What is claimed is:

1. A blow molded container comprising body and cover portions formed from a multilayer parison comprising:
   (a) an outer layer of a first blend of a polymeric resin and an antistatic agent; and
   (b) an inner layer of a second blend of a polymeric resin and an electrically conductive agent.

2. The container according to claim 1 wherein the outer layer is thinner than the inner layer.

3. The container according to claim 1 wherein the polymeric resin of the outer layer comprises a linear low density polyethylene.

4. The container according to claim 1 wherein the antistatic agent is selected from the group consisting of:
   (a) organic liquids;
   (b) ionic surface-active agents;
   (c) aromatic sulfonamides;
   (d) polyalkoxylated compounds;
   (e) fatty acid esters of polyhydroxy alcohols; and
   (f) blends of (d) and (e); and
   (g) a mixture of an acid copolymer and a quaternary amine.

5. The container according to claim 1 wherein the polymeric resin of the inner layer comprises a high density polyethylene.

6. The container according to claim 1 further comprising an additional inner layer of polymeric material or blends thereof.

7. The container according to claim 6 wherein the polymeric material comprises a blend of high density polyethylene and regrind material.

* * * * *